United States Patent [19]

Abele et al.

[11] Patent Number: 5,412,365
[45] Date of Patent: May 2, 1995

[54] HIGH FIELD MAGNETS FOR MEDICAL APPLICATIONS

[75] Inventors: Manlio G. Abele, New York; Henry Rusinek, Great Neck, both of N.Y.

[73] Assignee: New York University, New York, N.Y.

[21] Appl. No.: 185,726

[22] Filed: Jan. 24, 1994

Related U.S. Application Data

[63] Continuation of Ser. No. 909,143, Jul. 27, 1992, abandoned.

[51] Int. Cl.$^6$ .............................................. H01F 7/02
[52] U.S. Cl. ...................................................... 335/306
[58] Field of Search ................................. 335/296–306

[56] References Cited

U.S. PATENT DOCUMENTS

| | | | |
|---|---|---|---|
| 2,975,497 | 3/1961 | Budreck | 335/302 |
| 3,111,736 | 11/1963 | Budreck | 335/302 |
| 3,205,415 | 9/1965 | Seki | 335/306 |
| 3,768,054 | 10/1973 | Neugebauer | 335/306 |
| 3,784,945 | 1/1974 | Baermann | 335/302 |
| 4,224,590 | 9/1980 | Spodig | 335/306 |
| 4,456,898 | 6/1984 | Frischmann | 335/217 |
| 4,614,930 | 9/1986 | Hickey et al. | 335/302 |
| 4,990,879 | 2/1991 | Aubert | 335/306 |
| 4,994,777 | 2/1991 | Leupold et al. | 335/302 |
| 4,999,600 | 3/1991 | Aubert | 335/306 |
| 5,014,032 | 5/1991 | Aubert | 335/306 |
| 5,034,715 | 7/1991 | Leupold et al. | 335/306 |
| 5,049,848 | 9/1991 | Pulyer | 335/296 |
| 5,075,662 | 12/1991 | Leupold et al. | 335/306 |
| 5,103,200 | 4/1992 | Leupold | 335/217 |
| 5,107,238 | 4/1992 | Leupold | 335/306 |
| 5,126,713 | 6/1992 | Leupold | 335/304 |
| 5,148,138 | 9/1992 | Miyata | 335/302 |
| 5,184,395 | 2/1993 | Pan et al. | 29/609 |

OTHER PUBLICATIONS

Table 5f-13. Constants of Permanent-Magnet Materials. *American Institute of Physics Handbook*, McGraw-Hill, 3rd Edition.

"Linear Theory of Yokeless Permanent Magnets", M. G. Abele, EMMA '89, Rimini, Italy, 1989.

"Design of Yokeless Rare Earth Magnets for NMR Medical Imaging". M. G. Abele, Proceedings of the 10th International Workshop on Rare Earth Magnets, Kyoto, Japan, 1989, pp. 121–130.

"Optimum Design of Two-Dimensional Permanent Magnets", M. G. Abele, TR-21, Department of Radiology, New York University, 1989.

*Primary Examiner*—Leo P. Picard
*Assistant Examiner*—Ramon M. Barrera
*Attorney, Agent, or Firm*—Rosen, Dainow & Jacobs

[57] ABSTRACT

A high field strength permanent magnet has a plurality of layers, with at least two of the layers being formed of materials of different remanence. The remanence of the material of each layer is no greater than that of the layers thereunder, and is preferably less than the remanence of all underlying layers.

The inner layer may be formed of a magnetic structure in which all or part of a basic yoke has been replaced by a shunt of active material. Such a shunt may alternatively be employed in a single layer magnetic structure.

9 Claims, 12 Drawing Sheets

| n | 3 | 4 | 5 | 6 | 7 |
|---|---|---|---|---|---|
| K | 0.66 | 0.56 | 0.52 | 0.50 | 0.48 |
| M' | 0.095 | 0.118 | 0.124 | 0.125 | 0.124 |
| $K_1$ | 0.66 | 0.51 | 0.43 | 0.38 | 0.36 |
| $K_2$ | 0.09 | 0.27 | 0.29 | 0.29 | 0.30 |
| K | 0.76 | 0.78 | 0.72 | 0.67 | 0.66 |
| M" | 0.097 | 0.130 | 0.142 | 0.146 | 0.146 |

FIG.13

|  | .22T | | | | .44T | | | |
|---|---|---|---|---|---|---|---|---|
|  | $K_1$=.550 (FERRITE) | | $K_2$=.183 (RARE EARTH) | | — (FERRITE) | | $K_4$=.367 (RARE EARTH) | |
|  | M | W' | M' | W' | M | W' | M' | W |
| YOKELESS | .113 | 6.86 | .058 | 2.31 | — | — | .095 | 5.67 |
| YOKED | .148 | 5.24 | .0804 | 1.68 | — | — | .1373 | 3.94 |
| HYBRID | .179 | 4.34 | .109 | 1.23 | — | — | .168 | 3.22 |

RARE-EARTH HYBRID MAGNET
DESIGNED FOR 0.22T FIELD

HYBRID RARE EARTH MAGNET WITH FERRITE
SHUNT DESIGNED FOR A 0.22T FIELD

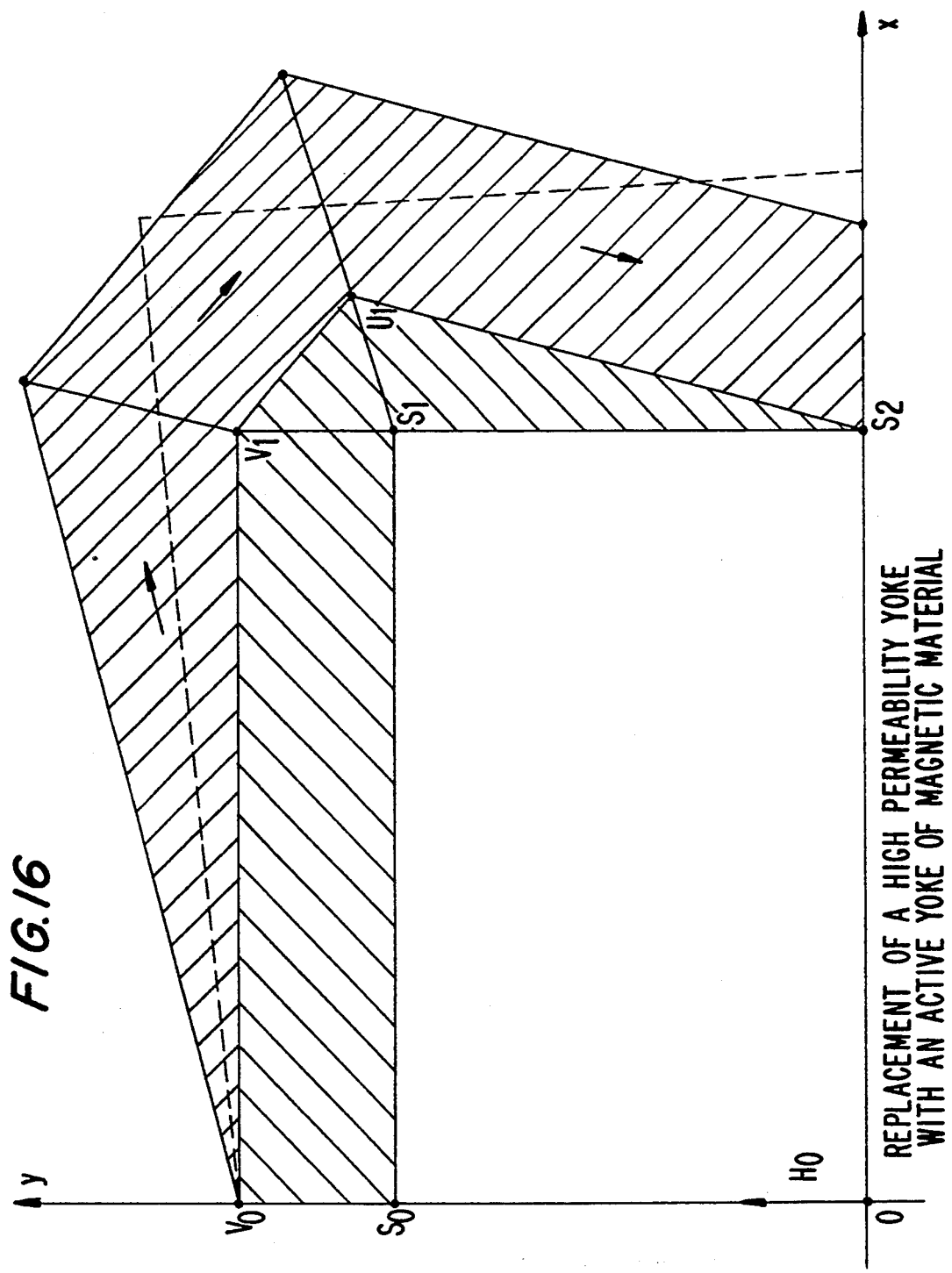

HIGH FIELD MAGNETS FOR MEDICAL APPLICATIONS

This application is a continuation of application Ser. No. 07/909,143, filed Jul. 27, 1992, now abandoned.

FIELD OF THE INVENTION

This invention relates to high field strength magnetic structure having improved efficiency. While the invention is of especial use for NMR magnets for medication applications, it will be apparent that the invention is not so limited.

BACKGROUND OF THE INVENTION

A basic requirement in the design of a permanent magnet is the efficient use of the energy stored within the magnetized material. In general, the design should be aimed at achieving the desired value of the intensity within the cavity of the magnet with a minimum volume and weight of the magnetized material.

Permanent magnets can be classified as yokeless magnets where the magnetic structure is designed in such a way that the field in confined within the magnet without the need of a high magnetic permeability yoke; yoked magnets where the magnetic material is used to generate the desired field within the region of interest and the field confinement is achieved with an external yoke, or hybrid magnets wherein the magnetic structure is designed to require only a partial yoke.

Yokeless permanent magnets can be designed with magnetic materials which have a quasi-linear demagnetization characteristic with a slope close to that of air. In this case, the magnetic structures are transparent to the field generated by other sources. This is an important property of the yokeless structures, which allows the designer to increase the strength of the field within the cavity by superimposing the fields generated by concentric magnets.

Yoked permanent magnets, on the other hand, are shielded from external sources by the same yoke which confines the field of the magnet. As a consequence, the field superposition property of yokeless structure does not apply to yoked magnets and the field strength attainable within the cavity has an upper limit dictated by the magnet geometry. Conversely, because the magnetic material performs only the function of generating the field within the cavity, in general yoked structures use less magnetic material than yokeless structures designed for the same field strength and the same geometry of the cavity. Thus, weight of the magnetic material may become an important factor in the choice between a yokeless and a yoked magnet design, particularly if the design parameters dictate the use of high energy, high cost magnetic materials.

The design methodology for two dimensional as well as three dimensional yoked and yokeless magnetic structures capable of generating a uniform field within a cavity of arbitrary geometry, and design optimization of such geometries, are discussed, for example, in "Linear Theory of Yokeless Permanent Magnets, M. G. Abele, EMMA '89, Rimini, Italy, 1989; "Design of Yokeless Rare Earth Magnets for NMRMedical Applications". M. G. Abele, Proceedings of the 10th International Workshop on Rare Earth Magnets, Kyoto, Japan, 1989, pp121–130; and "Optimum Design of Two-Dimensional Permanent Magnets", M. G. Abele, TR-21, Department of Radiology, New York University, 1989. This subject is also discussed in U.S. patent application Ser. No. 424,162 filed Oct. 19, 1989 and U.S. patent application Ser. No. 707,620 filed May 30, 1991 in the name of M. G. Abele, and assigned to the assignee of the present application. The above publications and applications are incorporated herein by reference.

SUMMARY OF THE INVENTION

The present invention is directed to a high field strength permanent magnet of the yokeless, yoked or hybrid type, and having improved efficiency.

Briefly stated, in accordance with one embodiment of the invention, a multi-layer high field strength permanent magnet is provided in which the outer permanent magnetic layer has a remanence that is lower than that of the inner layer. This feature enables the reduction of the required amount of high remanence material in the inner layer, to thereby enable the provision of a more economical structure, while, in many cases, increasing the figure of merit of the resultant structure. The structure may have more than two permanent magnetic layers, in which case the remanence of any permanent magnetic layer must not be greater than the permanent magnetic layers thereunder.

In accordance with a further feature of the invention, the inner layer of such a multilayer magnet may constitute a layer in which all or part of a basic yoke has been replaced by a shunt of magnetic material. The use of such a shunt also renders the inner layer transparent to the fields of the outer layer or layers.

BRIEF FIGURE DESCRIPTION

In order that the invention may be more clearly understood, it will now be disclosed in greater detail with reference to the accompanying drawings, wherein:

FIG. 13 is a table showing parameters for single layer two-dimensional magnets; .

FIG. 16 is a cross sectional diagram of a quadrant of a magnet illustrating the replacement of a high permeability yoke with an active yoke of magnetic material;

DETAILED DISCLOSURE OF THE INVENTION

A permanent magnet (FIG.1) makes use of magnetized material $V_m$ to generate the magnetic field of intensity $\vec{H}_c$ within the region of interest $V_c$. Conventional permanent magnets also include components designed to generate the desired distribution of $\vec{H}_c$ such as the pole pieces inserted between $V_m$ and $V_c$ and the yoke to confine the flux of the magnetic induction $\vec{B}$ within the magnetic structure.

The energy $W_m$ stored in the magnetized material and the energy $W_c$ within the region of interest are $$W_m = \frac{1}{2\mu_0} \int_{V_m} J^2 dV, \quad W_c = \frac{\mu_0}{2} \int_{V_c} H_c^2 dV, \quad (1)$$

where $\mu_0$ is the magnetic permeability of a vacuum and $J$ is the magnitude of the remanence $\vec{J}$ of the magnetic material. An optimum design is achieved when the figure of merit M defined as $$M = \frac{W_c}{W_m} \quad (2)$$

attains its maximum.

Figure 1:
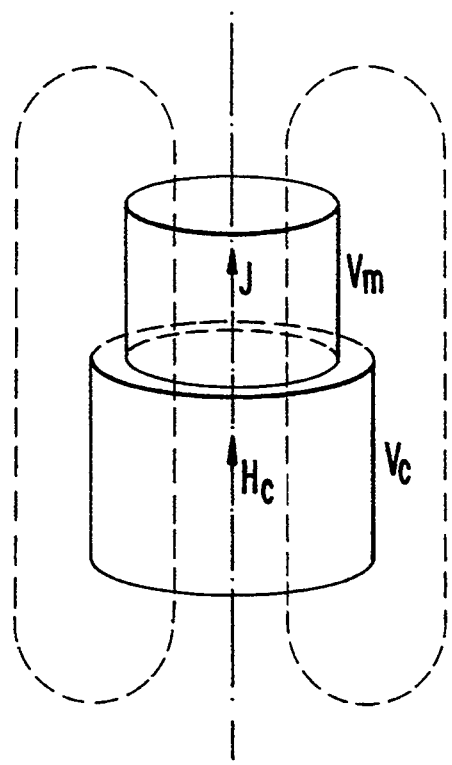
FIG. 1 is a basic schematic diagram of a permanent magnet.

The absolute upper limit of M can be determined by assuming an ideal design where both the total flux of the induction $\vec{B}$ produced by $\vec{J}$ as well as the field intensity $\vec{H}$ are constrained within the volume of interest $V_c$ (FIG. 1). Let $V_m$ be an ideal rigid magnetic material characterized by a linear demagnetization curve with zero magnetic susceptibility. Intensity $\vec{H}_m$ and induction $\vec{B}_m$ within $V_m$ are related to $\vec{J}$ by the equation $$\vec{B}_m = \mu_0 \vec{H}_m + \vec{J} \quad (3)$$

Define two dimensionless parameters K and $K_m$ as $$K = \frac{\mu_0 H_c}{J}, \quad K_m = \frac{\mu_0 H_m}{J}. \quad (4)$$

Assuming that $\vec{J}$ and $\vec{H}_c$ are uniform, eq. 1 transforms to $$W_m = \frac{B_m H_m V_m}{2K_m(1-K_m)}, \quad W_c = \frac{\mu_0}{2} H_c^2 V_c. \quad (5)$$

By virtue of the fundamental equations of magnetostatics $$B_m H_m V_m = \mu_0 H_c^2 V_c \quad (6)$$

and eq. 2 becomes $$M = K_m(1 - K_m), \quad (7)$$

independent of the value of the field intensity region of interest $V_c$.

The optimum value of $K_m$ is $K_m = \frac{1}{2}$ and the maximum value of M and the minimum volume of $V_m$ that can be attained in a permanent magnet are $$M_{max} = \frac{1}{4}, \quad V_{min} = 4K^2 V_c. \quad (8)$$

The elementary considerations leading to eq. 8 define the limits of practical applications of a permanent magnet designed to generate a uniform field. In principle a magnet can be designed for $K > K_m$. Thus in applications (such as NMR medical imaging) that require large volumes of the region of interest, considerations of cost and weight establish a practical upper limit of the field strength of the order of remanence.

Figure 2:
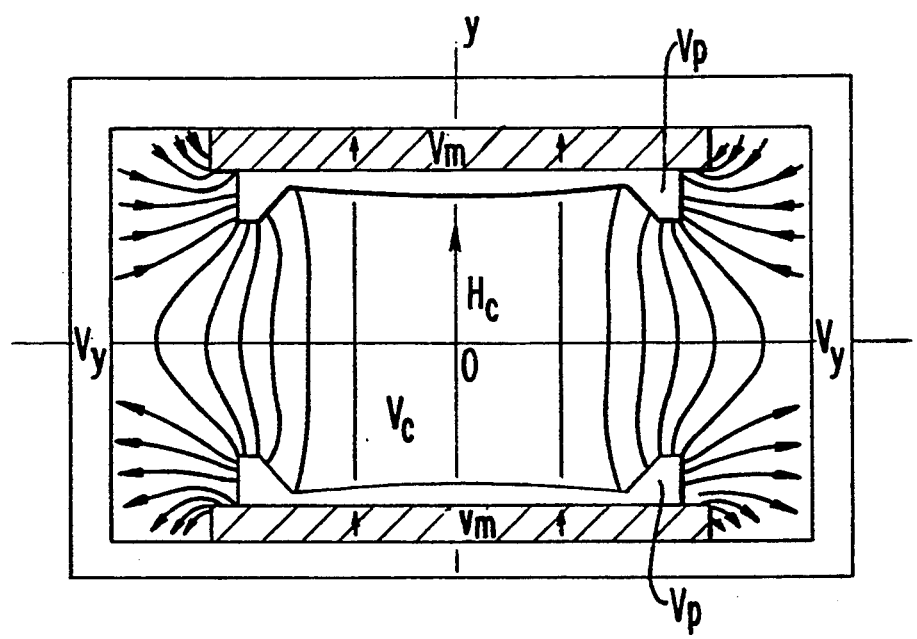
FIG. 2 is a cross sectional illustration of a traditional magnet design.

Traditional magnets rely on the ferromagnetic components to shape and confine the field. FIG. 2 exemplifies the category of traditional magnets designed to generate a highly uniform field within the region of interest. The magnet is an axisymmetric structure whose essential components are the magnetic material in the lined regions $V_m$, the pole pieces $V_p$ and the external yoke $V_y$ that totally encloses the structure.

The absence of a physical boundary of the volume interest is a characteristic feature of the traditional magnet design. Another essential characteristic of the traditional design of FIG. 2 is the freedom of choosing independently the two parameters $K_m$ and K defined by eq. 4. The structure of FIG. 2 is designed for the value of K $$K = 0.16 \quad (9)$$

and is optimized by selecting $K_m = \frac{1}{2}$.

If the magnetic material is a Nd.Fe.B rare earth alloy with a remanence $J \approx 1.25$ T, the value of eq. 9 corresponds to a field $\mu_0 H_c \approx 0.2$ T at the center of the magnet.

The field configuration in the air gap is controlled primarily by the geometry of the pole pieces $V_p$. FIG. 2 shows the lines of flux of the magnetic induction in air. As apparent in the figure, the field distortion increases as the distance from the center increases.

Define a dimensionless factor L as $$L = \frac{\mu_0 H_c^2 V_c}{B_m H_m V_m} < 1. \quad (10)$$

By virtue of eq. 10 the figure of merit is $$M = K_m(1 - K_m L. \quad (11)$$

L is smaller than unity because of two factors: first, only a fraction of the flux of $\vec{B}$ closes through the region of interest and second, the flux of $\vec{B}$ that closes through the region of interest goes through a region of air outside of the region of interest itself. In an open structure such as the magnet of FIG. 2, $L << 1$ and is consequence, the figure of merit is far below the theoretical limit of equation (8) even if the design is optimized with the selection of $K_m = \frac{1}{2}$.

A substantial improvement of the traditional design of FIG. 2 is achieved by shifting the emphasis of the design from the ferromagnetic components to the magnetic material that encloses the region of interest. Consider for instance the structure of FIG. 3 which represents the first quadrant of the cross-section of a two-dimensional magnet, designed to generate a uniform field $\vec{H}_c$ within a rectangular region V: confined by the pole pieces $V_p$ and the triangular element of magnetic material of remanence a $\vec{J}_{2,1}$. $\vec{H}_c$ is assumed to be oriented in the positive direction of the axis y and in the example of FIG. 3 its magnitude is chosen to be $$\frac{\mu_0 H_c}{J_1} = K = 0.4, \quad (12)$$

where $J_1$ is the magnitude of the remanence within the rectangular region ($V_0 V_1 W_1 W_0$). $\vec{J}_1$ is also oriented in the positive direction of the axis y. The pole pieces as well as the external yoke represented by the dotted line and heavy line ($W_0 W_1$) in FIG. 3 are assumed to be composed of an infinite permeability material.

The structure of FIG. 3 is designed to generate a uniform field $\vec{H}_m$ within the region ($V_0 V_2 W_1 W_0$) whose dimension $x_1$ along the x axis is such that the total flux of $\vec{B}_m$ generated by $\vec{J}_1$ is equal to the flux of $\mu_0 \vec{H}_c$ within the region (O $S_0 S_1 S_2$). Thus the abscissa $x_1$ of point $V_1$ is related to the abscissa $x_2$ of point $S_1$ by the equation $$x_1 = 0.8 x_2. \quad (13)$$

The uniform field $\vec{H}_m$ within the medium of remanence $\vec{J}_1$ is achieved by means of the trapezoidal region ($S_1 T_1 W_1 V_1$) of magnetic material where the induction $\vec{B}$ satisfies the condition $$\vec{B} = 0. \quad (14)$$

The remanence $\vec{J}_{1,2}$ of the region ($S_1 T_1 W_1 V_1$) satisfies eq. 14 and its component along the axis y satisfies the boundary condition on interface ($V_1 W_1$).

$$(J_{1,2})_y = \mu_0 H_m. \quad (15)$$

Assume that the magnitude of $\vec{J}_{1,2}$ is equal to $J_1$ and that $J_1$ and $H_m$ satisfy the optimum design condition of $K_m = \frac{1}{2}$. By virtue of eq. 14, since side ($T_1 W_1$) is perpendicular to a $\vec{J}_{1,2}$, ($T_1 W_1$) is an equipotential line of potential $\Phi = 0$. Side ($S_1 V_1$) of the pole piece $V_p$ is parallel to ($T_1 W_1$).

The uniform field $\vec{H}_c$ within $V_c$ is achieved by selecting a remanence a $\vec{J}_{2,1}$ of triangle ($S_1 S_0 t_1$) that also satisfies the condition of equation 14. The y component of $\vec{J}_{2,1}$ is $$(J_{2,1})_y = -\mu_0 H_c. \quad (16)$$

Side ($S_2 T_1$) of triangle ($S_1 S_2 T_1$) is perpendicular to $\vec{J}_{2,1}$ and, as a consequence, ($S_2 t_1$) is also an equipotential line $\Phi = 0$. By virtue of eqs. 14, 16 and condition $J_{2,1} = J_1$, the angle $\theta_2$ between side ($S_2 T_1$) and the x axis in FIG. 3a is given by $$\cos\theta_2 = \frac{\mu_0 H_c}{J_{2,1}}. \quad (17)$$

Because no flux of $\vec{B}$ is present in the regions of remanences $\vec{J}_{1,2}$ and $\vec{J}_{2,1}$, sides ($T_1 W_1$), ($S_2 T_1$) do not have to be part of the interface between the magnetic structure and the external yoke. Thus the geometry of the yoke may be selected arbitrarily, as shown by the dotted line in FIG. 3a.

The uniformity of the field and the confinement of the flux of $\vec{B}$ within the region of interest are achieved with magnetic materials that cannot operate at the peak of the energy product curve, because they must satisfy condition 14. Therefore, the optimum design condition $K_m = \frac{1}{2}$ does not extend to the entire magnetic structure, resulting in a figure of merit lower than the ideal limit of equation 8.

Figure 3B:
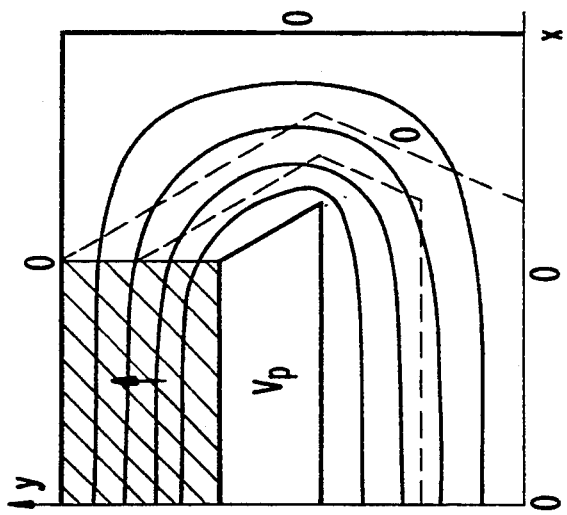
FIG. 3(b) illustrates the magnet of FIG. 3(a) after removal of the components of remanences $\vec{J}_{1,2}$, $\vec{J}_{2,1}$.
Figure 3A:
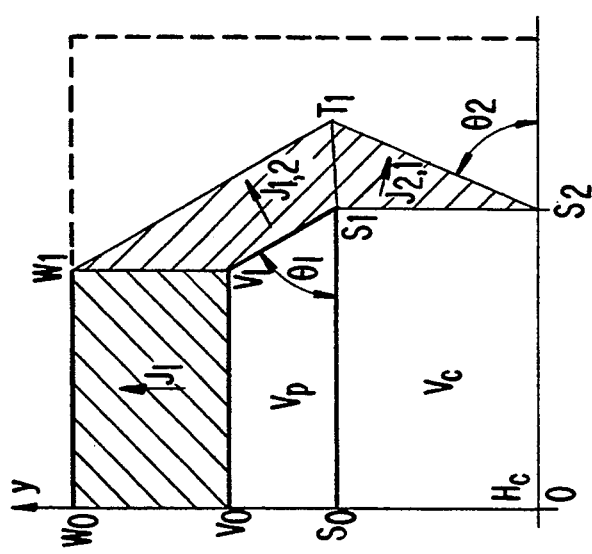
FIG. 3(a) illustrates the closure of a quadrant in a yoked magnet designed for K=0.4.

Eq. 17 shows that the type of structure depicted in FIG. 3a is limited to the generation of values $\mu_0 H_c$ that cannot exceed the remanence of the magnetic material of the triangular region ($S_1 S_2 T_1$). FIG. 3b shows the effect of the removal of the regions of remanence $\vec{J}_{1,2}$, $\vec{J}_{2,1}$ on the configuration of equipotential lines. The dotted lines are the equipotential lines of the structure of FIG. 3a. In a traditional magnet, because the field is not uniform within the gap between pole pieces, the region of interest $V_c$ must be defined as the area where the field intensity $\vec{H}$ is bound between assigned limits, i.e.

$$v_c(h) = \{p : |\vec{H}_p - \vec{H}_0| < h|\vec{H}_0|\}, \quad (18)$$

where h is small compared to unity and $\vec{H}_0$ is the value of $\vec{H}$ at the center of the gap. The figure of merit defined by eq. 2 can be written in the form $$M = K^2 \frac{V_c(h)}{V_m}. \quad (19)$$

Figure 4:
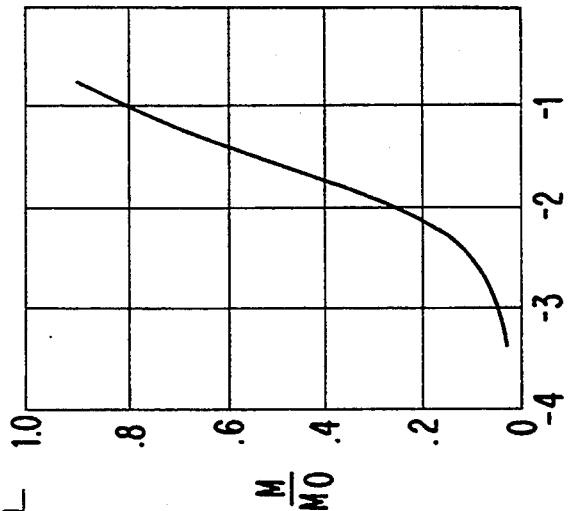
FIG. 4 illustrates the figure of merit M vs field uniformity defined by the parameter h.

A plotting of M versus h is shown in FIG. 4 where $M_0$ is the figure of merit computed on the assumption that $V_c$ coincides with the full rectangular area between pole pieces. As shown in the graph, the geometry of the pole pieces of a traditional magnet must be substantially altered, like in the magnet of FIG. 3 in order to maintain a value of M of the order $M_0$.

The closure of the cavity in a traditional magnet thus has several beneficial effects. First, it makes it possible to extend the region of uniform field to the full closed cavity. Second, it eliminates the fringe field between the magnetic structure and the external yoke. Third, the elimination of the space between magnetic structure and yoke reduces the dimensions and weight of the magnet.

Figure 5A:
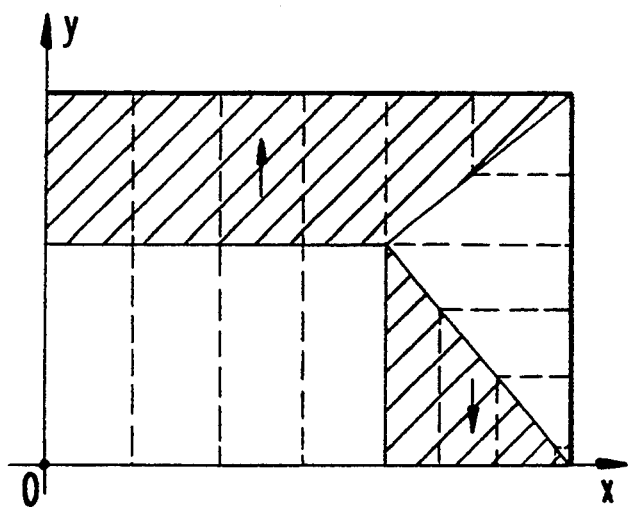
FIG. 5(a) is a cross sectional view of a quadrant of a yoked magnet.

It can be shown that a uniform field within the cavity can be generated without pole pieces by means of structures of uniformly magnetized polyhedrons. These structures can be classified in three basic categories: yoked magnets where the flux confinement is achieved with an external yoke, yokeless magnets where the flux is confined within the same magnetic material that generates the field and hybrid magnets that combine the properties of both yoked and yokeless structures. FIG. 5(a) shows the first quadrant of a typical two-dimensional yoked structure with a rectangular cross section cavity designed to generate a uniform field perpendicular to one side of the rectangle. The structure is designed for K=0.4, the same as in FIG. 3. The heavy line represents an ideal yoke of $\mu = \infty$ material, and the dotted lines are the lines of flux of $\bar{H}$. Note that the remanences of the two magnetic prisms have equal magnitude $J_1$ and are oriented in opposite directions. The dimensions $2x_1$, $2y_1$ of that external boundary of FIG. 5 are given by $$x_1 = x_0 + y_0 \sqrt{\frac{K}{1-K}}, \quad y_1 = \frac{y_0}{1-K}, \quad (20)$$

where $2x_0$, $2y_0$ are the dimensions of the rectangular cavity. FIG. 5 shows that in the region of $x > x_0$, the flux of $\bar{B}$ circulates between the yoke and the magnetic material, outside the cavity. Thus in the yoked magnet, as in the traditional magnet, part of the energy stored in that magnetic material is wasted in the fringe field.

Figure 5B:
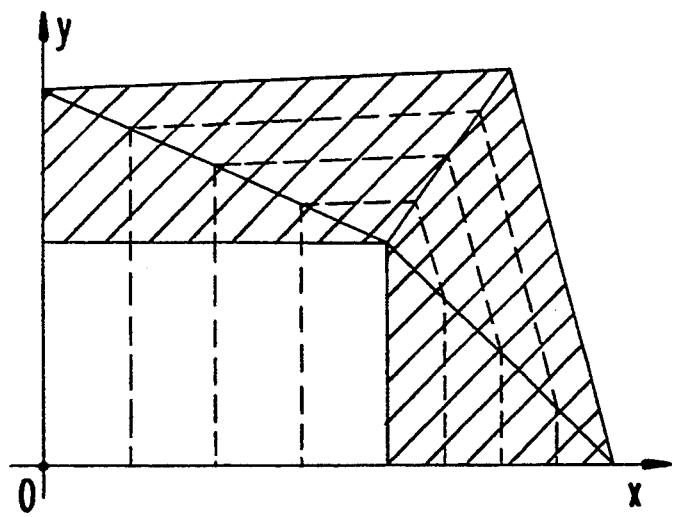
FIG. 5(b) is a cross sectional view of a quadrant of a yokeless magnet.

FIG. 5b shows the first quadrant of a yokeless structure designed for the same value K=0.4 and the same rectangular cavity of FIG. 5(a). The flux of $\bar{B}$, shown by the dotted lines, is confined within the magnetic material. The yokeless magnet of FIG. 5b uses significantly more magnetic material than the magnet in FIG. 5a due to the fact that the yokeless magnet performs the two functions of generating and confining the field.

Figure 6:
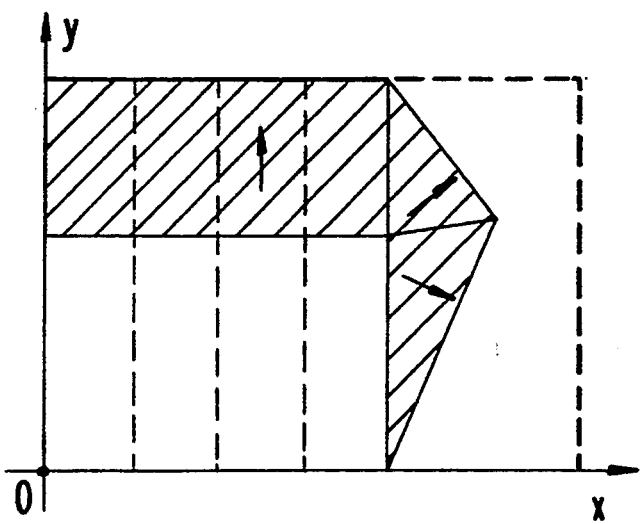
FIG. 6 is a cross sectional view of a quadrant of a hybrid magnet.

The magnetic structure of FIG. 6 is an example of hybrid magnet designed for the same value of K and the same rectangular cavity as in FIG. 5. In FIG. 6 the magnetic structure in the region $x > x_0$ of FIG. 5a is replaced by two triangular components designed to confine the field and to satisfy eq. 14. The remanences of the triangular components are perpendicular to their external surfaces and the coordinates of point T in FIG. 6 are $$\begin{cases} x_T = \dfrac{K y_0}{K \sqrt{K(2-K)} + (1-K)\sqrt{1-K^2}} + x_0 \\ y_T = \dfrac{\sqrt{1-K^2}\, y_0}{K\sqrt{K(2-K)} + (1-K)\sqrt{1-K^2}} \end{cases} \quad (21)$$

The field outside of the two yokeless triangular components in FIG. 6 is zero. As a consequence, the sole function of the external yoke of the hybrid magnet is to close the flux generated by the rectangular component of magnetic material. The external dotted line in FIG. 6 corresponds to the selection of an external yoke identical to the one in FIG. 5(a). The reduction of the amount of magnetic material in the hybrid magnet of FIG. 6 compared to the yoked magnet is apparent. The figures of merit of the three types of two-dimensional magnets with a rectangular cavity of dimensions $x_0 = 3/2 y_0$ are plotted in FIG. 7 versus the value of parameter K.

FIGS. 5(a), 5(b) and 6 are cross sectional views of quadrants of magnetic structures surrounding a rectangular cavity. The three types of structures shown in FIGS. 5(a), 5(b) and 6 are capable of generating values of K in the range;

$$0 < K < 1 \quad (22)$$

In these figures, as well as in the subsequently illustrated structures, the cross-hatched areas with arrows represent permanent magnets with remanences in the directions of the arrows, the heavy solid lines represent yokes, the light dotted lines represent equipotential lines, and the heavy dotted lines represent optional yoke material. The closed yokes in FIGS. 5 (a) and 6 shield the yoked and hybrid magnets from an external field in the region surrounding the magnets. By contrast, the yokeless structure of FIG. 5(b) is transparent to an external field. Thus, if the structure of FIG. 5(b) is inserted within another magnet, the field inside the cavity is increased by the value of the field generated by the external magnet, as long as the linear approximation of the demagnetization curves is valid. This is the basis of a multilayered design approach according to the invention that makes it possible to increase the figure of merit and to reach value of K larger than unity.

Figures 7, 8:
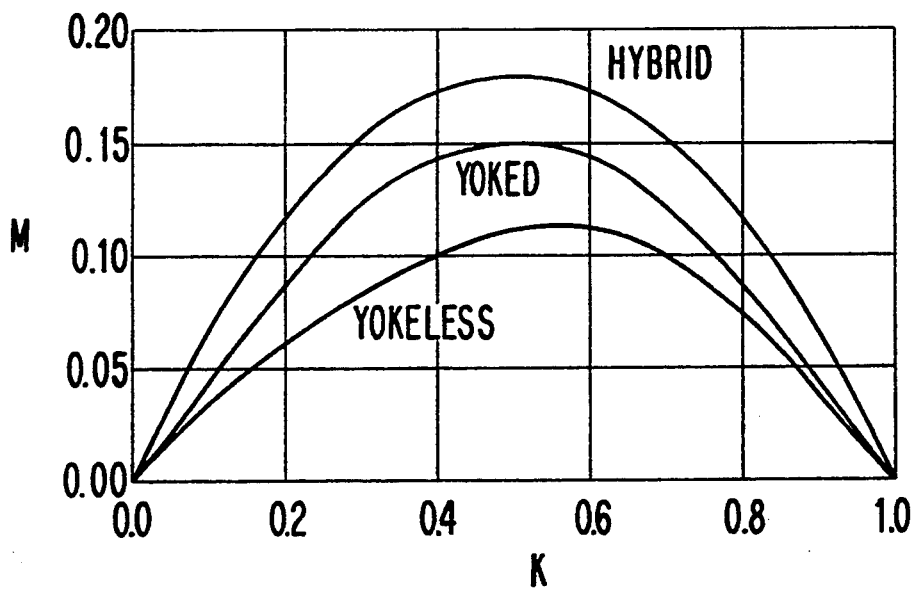
FIG. 7 is a plot of the figure of merit M versus K for yoked, yokeless and hybrid magnets.
FIG. 8 is a table illustrating parameters of an optimum single and two layer magnets with regular cavities of n sides.

The improvement of the figure of merit that results from a multilayered design approach is apparent by comparing the optimum values of the figure of merit M' for a single layer and the figure of merit M'' for two layer magnets designed around a regular polygonal cavity of n sides, as seen in FIG. 8.

A multilayered structure can be built with layers of different magnetic properties. Consider a yokeless two-dimensional structure of material of remanence $J_1$ and assume that a thin layer of the material is removed on the outside of the structure and replaced with a thin layer of material of remanence $J_2 \neq J_1$, in such a way that the field within the cavity remains unchanged. If $A_r$ is the area of the removed material of remanence $J_1$ and $A_2$ the area of the new material of remanence $J_2$, then the field inside of the cavity is unchanged if $$A_r J_1 \approx A_2 J_2 \quad (23)$$

If $M_0$ is the figure of merit and $A_0$ the cross sectional area of the original structure of remanence $J_1$, the figure of merit of the two layer structure is:

$$M = K^2{}_0 \frac{A_c}{(A_0 - A_r) + A_2 \dfrac{J^2{}_2}{J^2{}_1}} \quad (24)$$

where $K_0, A_0$ are the values of K and $A_1$ for $A_r = 0$. By virtue of (23), equation (24) becomes:

$$\mu = \mu_0 \frac{1}{1 - \left(1 - \dfrac{J_2}{J_1}\right) \dfrac{A_r}{A_0}} \quad (25)$$

where $$\mu_0 = K^2{}_0 \frac{A_c}{A_0} \quad (26)$$

Because of the thin layer assumption, $A_r < A_0$ and equation 25 results in:

$$K\mu > \mu_0 \quad (27)$$

as long as:

$$J_2 < J_1 \quad (28)$$

Assume a value $K_0$ of $$\frac{J_2}{J_1} < K_0 < 1 \quad (29)$$

As $A_r$ increases, a minimum value of the remaining area $A_0-A_r$ of the material of remanence $J_1$ is reached that generates a field given by $$K_1 = K_0 - \frac{J_2}{J_1} \tag{30}$$

Figure 9:
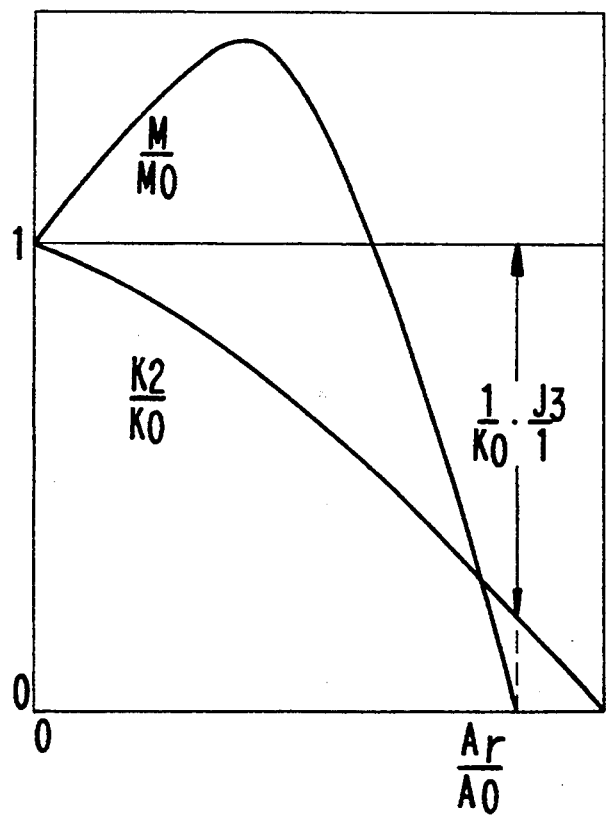
FIG. 9 is a graph illustrating the figure of merit M of a magnet having two layers of different remanences.

On the other hand, the area $A_2$ of material of remanence $J_2$ necessary to generate an induction equal to $J_2$ diverges, i.e. the figure of merit vanishes when the area magnetic structure of the material satisfies equation 30. Thus, by virtue of equation 28, as $A_r$ increases, the figure of merit increases, reaching a maximum before decreasing to zero, as shown in FIG. 9. The abscissa of the maximum of M in FIG. 9 increases as K decreases, and if K is sufficiently small compared to $J_2/J_1$, the maximum of M is found outside of the range $$\frac{A_r}{A_0} = 1 \tag{31}$$

Thus, for $K<J_2/J_1$ the total replacement of the material of remanence $J_1$ with the lower remanence material yields a more efficient design. Conversely, as K increases, the use of an external, lower remanence layer, results in a better efficiency and saving of the high remanence material. This is of particular importance in magnets designed with expensive rare earth alloys.

An improvement of the figure of merit over the traditional design is achieved by closing the cavity. Modern designs, in particular multilayered yokeless structures, make it possible to achieve high values of the figure of merit, with fields of the order of remanence of the magnetic material.

Figure 10:
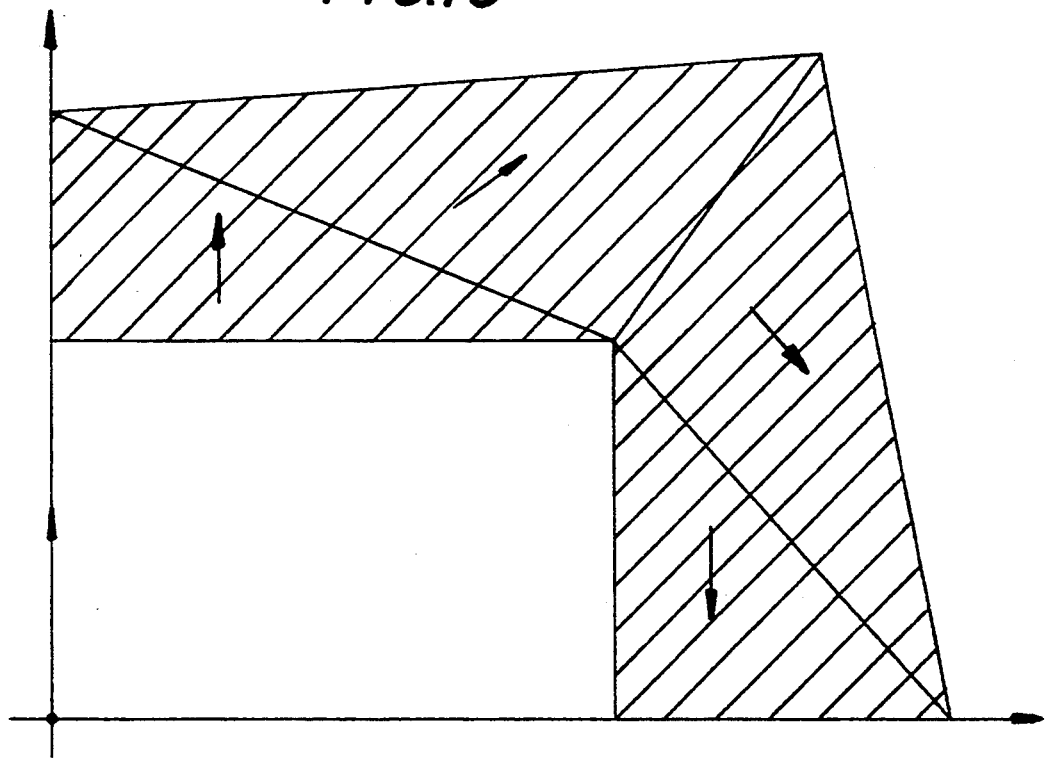
FIG. 10 is a cross sectional diagram of a quadrant of a yokeless magnet designed for K=0.367.
Figure 11:
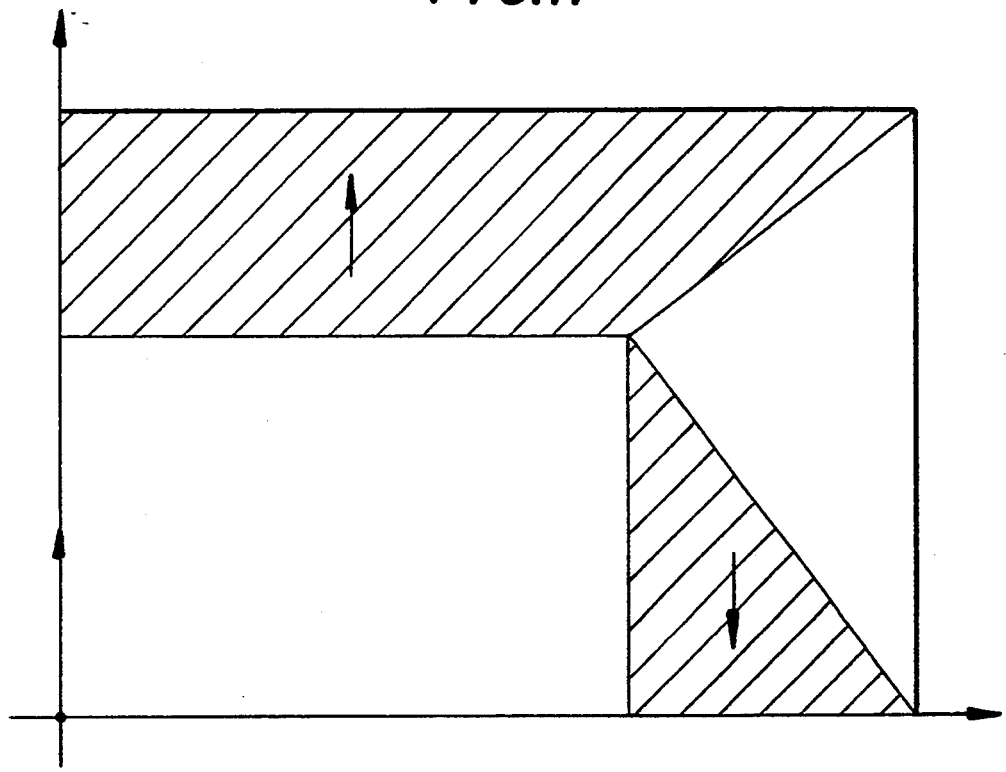
FIG. 11 is a cross sectional diagram of a quadrant of a yoked magnet designed for K=0.367.
Figure 12:
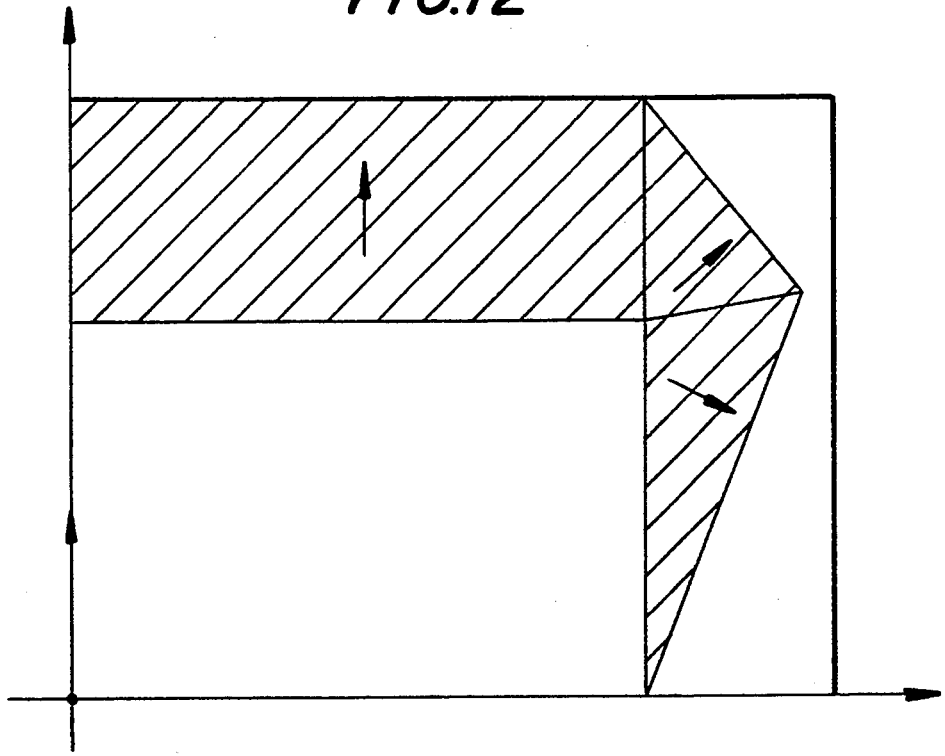
FIG. 12 is a cross sectional diagram of a quadrant of a hybrid magnet.

Consider now the design of two-dimensional structures capable of generating a uniform magnetic field of 0.44 T. A single layer design must be based on a rare earth material for $K_2 \approx 0.367$, and basic yokeless, yoked and hybrid structures for these configurations are illustrated in FIGS. 10, 11 and 12. The values of the figure of merit M and W in tons/meter for these structures are shown in the table of FIG. 13. Compared to the rare earth structures designed for $K_2=0.183$, the increased value of $K_2$ yields a significant increase in the figure of merit. The hybrid design results in the highest value of M and the lowest amount of magnetic material.

At the high field level, the multiple layer design approach offers several solutions ranging from a multilayered ferrite structure to a combination of rare earth and ferritte layers. Consider, for example, the yokeless structure of FIG. 10 and assume that a thin layer of rare earth material is removed on the outside of the structure and replaced by a thin layer of ferrite material such that the field intensity given by equation 23 within the cavity remains unchanged. In accordance with the invention, the figure of merit of the new structure is improved. This improvement, however, occurs only if the thin layer on the outside of the structure is replaced by a material of lower remanence than that of the inner layer or layers.

Figure 14:
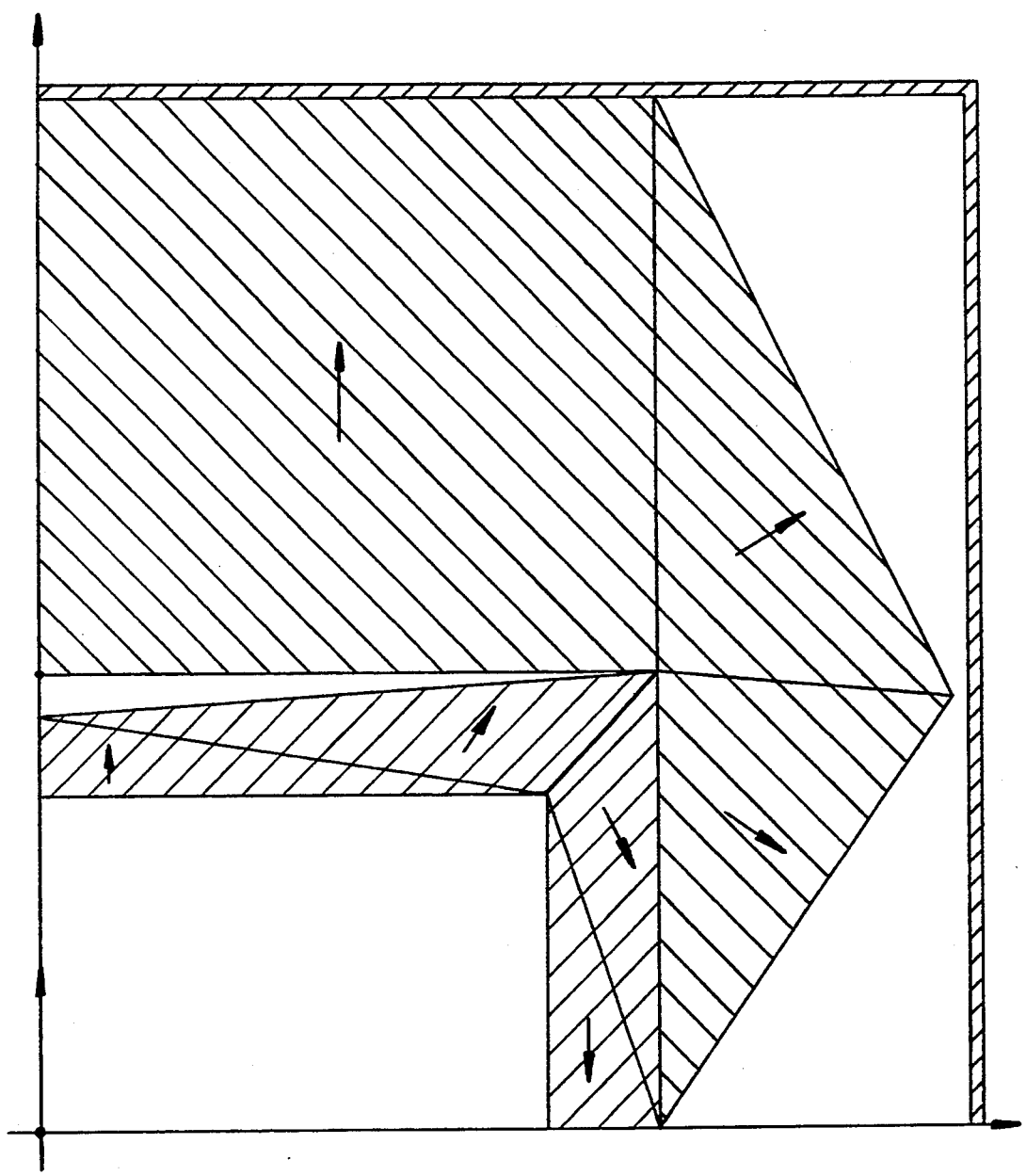
FIG. 14 is a cross sectional diagram of a quadrant of a two layer magnet having a yokeless inner layer and a yoked outer layer.

By virtue of these considerations, the 0.44 T field can be attained with a two layer design that combines an inner yokeless structure of rare-earth material and an outer structure of ferrite. In the schematic of FIG. 14, the inner layer is the same rare earth yokeless magnet designed for a value of $K_2$ of 0,183, and the outer layer is an hybrid ferrite magnet designed around a rectangular cavity that contains the inner layer. The value of $K_1$ of the ferrite magnet is 0.5. Thus in the schematic of FIG. 14 the two layers contribute equally to the field within the cavity.

The figure of merit of the double layered magnet of FIG. 16 is:

$$M \approx 0.159 \tag{32}$$

and the weight of the ferrite and rare earth layer are $$\begin{cases} W_{Fe} \approx 6.46 \quad \text{(tons/m)} \\ W_{Nd} \approx 2.31 \quad \text{(tons/m)} \end{cases} \tag{33}$$

Figure 15:
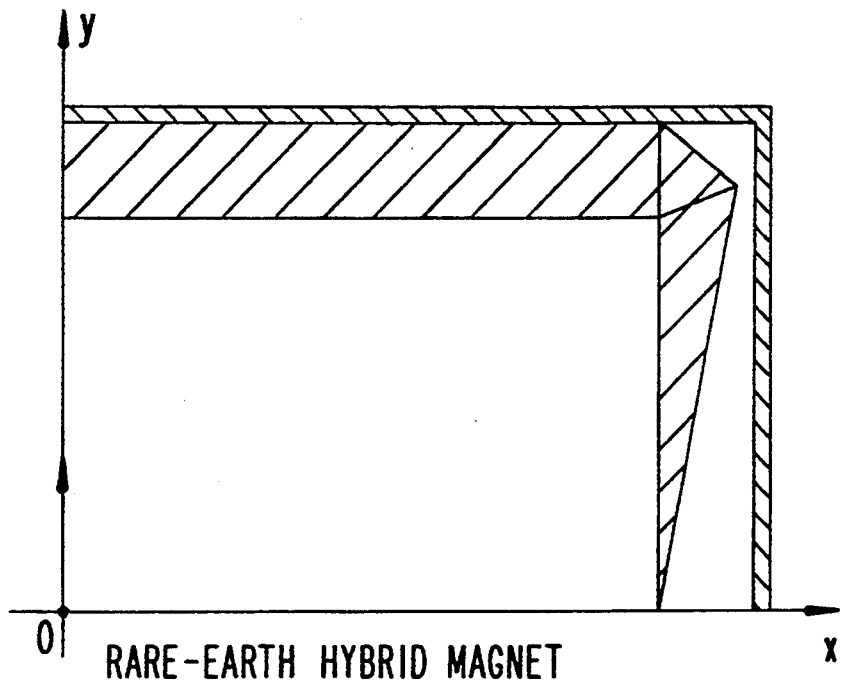
FIG. 15 is a cross sectional diagram of a quadrant of a rare-earth hybrid magnet inner layer designed for a 0.22 T field.
Figure 17:
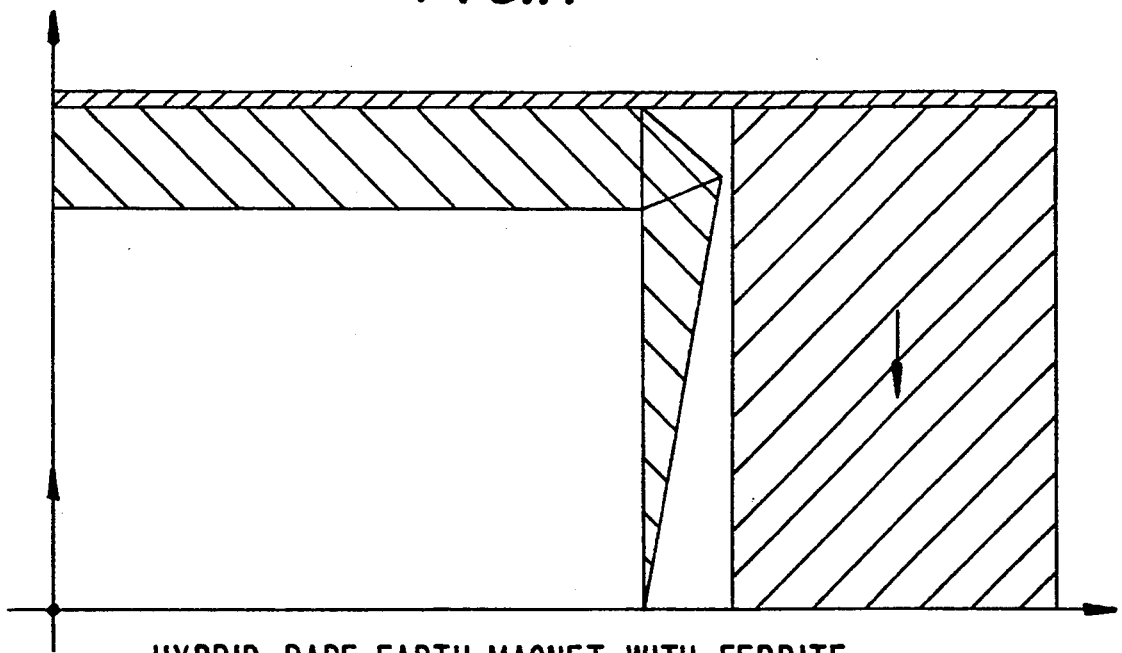
FIG. 17 is a cross sectional diagram of a quadrant of a magnet illustrating a hybrid rare earth magnet with a ferrite shunt.

An even larger value of the figure of merit can be achieved by using the hybrid rare earth material magnet of FIG. 15 as the inner layer of the double layered magnet. The hybrid structure Of FIG. 15 can be made transparent to the field of the external ferrite magnet by replacing the infinite permeability yoke with the active yoke of permanent magnetic material shown in FIG. 16. Furthermore, if magnetized ferrite is used to close the flux of the rare-earth magnet, the hybrid structure of FIG. 15 transforms into the structure of FIG. 17. The partial yoke of infinite permeability material is shunted by the rectangular ferrite permanent magnetic component that satisfies the condition $\vec{B}=\vec{J}_2$. Thus, the dimension $X_1$ of the ferrite shunt is $$x_1 = K_1 \frac{J_1}{J_2} x_0 \approx 0.55 \, x_0 \tag{34}$$

Figure 18:
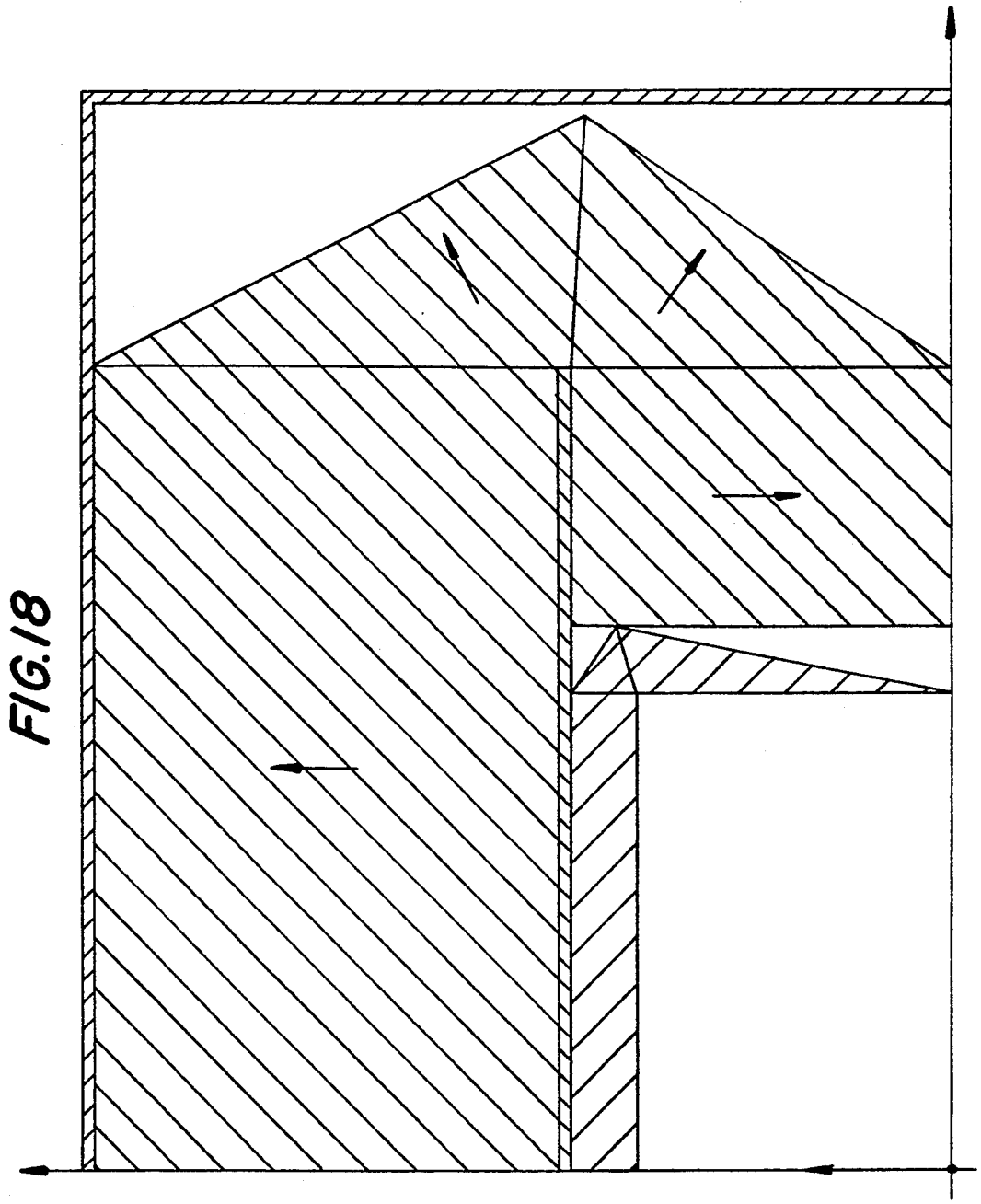
FIG. 18 is a cross section diagram of a quadrant of a magnet illustrating a hybrid two layer structure with an external ferrite magnet.

FIG. 18 shows the hybrid two layer structure with the external ferrite magnet designed for the same value of $K_1=0.55$. The figure of merit of the structure of FIG. 18 is $$M \approx 0.182 \tag{35}$$

and the weights of the rare earth and ferrite layers are:

$$\begin{cases} W_{Fe} \approx 10.1 \quad \text{(tons/m)} \\ W_{Nd} \approx 1.23 \quad \text{(tons/m)} \end{cases} \tag{36}$$

As expected, the structure of FIG. 18 makes use of a much smaller amount of rare-earth material than the structure of FIG. 14. Both of these structures achieve a substantial reduction of the amount of rare earth material compared to the hybrid single layer magnet designed for the same field ($K_2=0.367$) as listed in FIG. 12. The structure of FIG. 18 exhibits the highest value of the figure of merit, in spite of the much larger amount of ferrite material that is used. In both structures, the external yoke represented by the external double lines in the schematics of FIG. 14 and 18 carries only the flux generated by the outer ferrite layer, because the flux generated by the rare earth inner layer closes within the internal layer itself.

In accordance with a further embodiment of the invention, the closing of the flux of $\vec{B}$ within an equipotential region can always be achieved by replacing the high magnetic permeability ferromagnetic yoke with a yoke of magnetic material of zero magnetic susceptibility designed in such a way that within its components $$\vec{B} = \vec{J} \quad (37)$$

Thus, the passive $\mu = \infty$ yoke can be replaced by an active yoke of magnetized material. A possible configuration of such a yoke is shown in FIG. 16 where the lined outer area (from left to right) is the magnetic material that satisfies the condition of equation 47. The heavy arrows indicate the orientation of the remanence that is parallel to the external boundary of each component of the structure. The geometry of FIG. 16 corresponds to the selection of a remanence equal to the remanence $J_1$ of the rectangular region ($V_0V_1S_1S_0O$). ($V_0V_1$) is the interface between this region and the triangular component of the new structure whose external boundary forms an angle $\Theta$ with respect to the axis x, given by $$\sin\Theta = K \quad (38)$$

As in the case of an ideal $\mu = \infty$ ferromagnetic yoke, one can arbitrarily select the internal boundary of the other two components of remanence $\vec{J}$. FIG. 16 corresponds to the particular case where the ($V_1U_1S_2$) is the interface between the regions of remanences $\vec{J}_{1,2}$, $\vec{J}_{2,1}$ and the two components of the active yoke.

Comparing the structure of FIG. 16 with a yokeless, single layer magnet designed with the method developed above, the dotted line in FIG. 16 shows the external boundary of such a magnet designed around the rectangular cavity (O $S_0$ $S_1$ $S_2$) for the same value of K. The difference in total area between the two magnetic structures is quite apparent. The yokeless magnet designed with the above described, where each component generates and channels the flux of $\vec{B}$, exhibits a substantially smaller volume of magnetic material.

Figure 19:
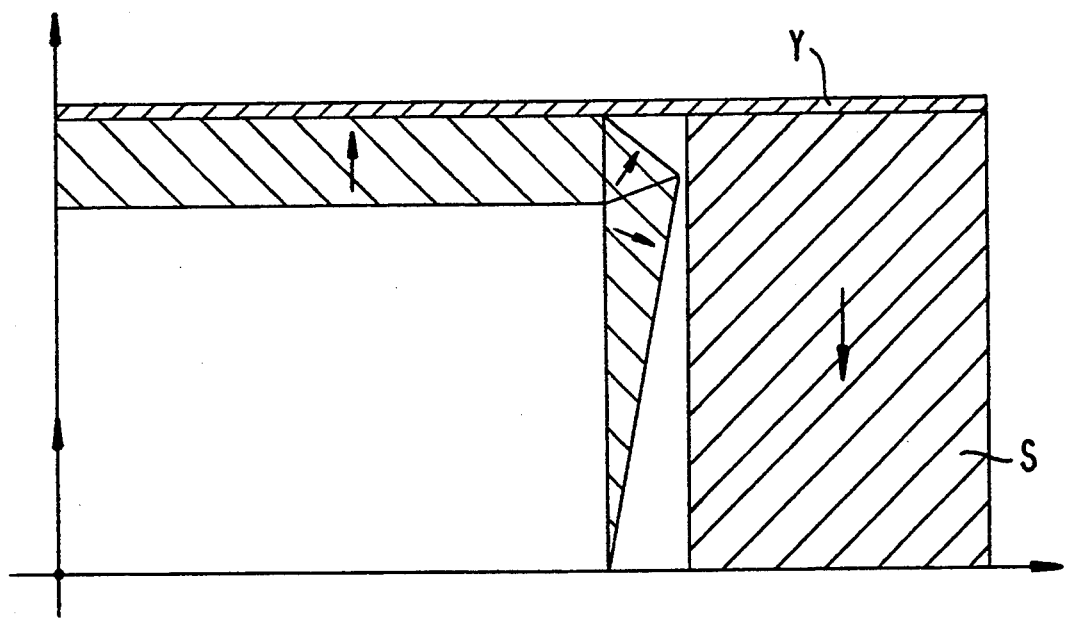
FIG. 19 is a cross sectional view of a quadrant of a magnet in which a portion of the yoke has been replaced by a shunt of active material.

The cross-hatched magnetic structure illustrated in FIG. 16 thus represents a yokeless structure that is transparent to an outer magnetic layer, this arrangement constituting a total replacement of the yoked structure of, for example, FIG. 11. Alternatively, as illustrated in FIG. 16, the portion of the yoke Y to the right of the inner layer may be replaced by a magnetic shunt S. The shunt may have the same remanence as the material of the inner layer, but it is more economical to form it of a material of lower remanence. An hybrid inner layer formed in accordance with the shunted structure of FIG. 19 is also transparent to any field, for example from an outer layer, oriented in any direction. The shunt, in accordance with the invention, thus constitutes a replacement of all or part of a basic yoke of high permeability material with an active element.

It is of course apparent that, in accordance with the invention, a shunt may also be advantageously employed in a single layer magnetic structure, for example in the form illustrated in FIGS. 16 and 19.

While the invention has been shown and described with reference to a limited number of embodiments, it will apparent that many further variations and modifications may be made without departing from the invention. It is therefore intended in the following claims to cover each such variation and modification as falls within the true spirit and scope of the invention.

What is claimed is:

1. A high strength permanent magnet comprising a plurality of layers of permanent magnetic material, each of said permanent magnet layers having an inner side and being positioned to generate a uniform magnetic field perpendicular to a portion of the respective said inner side in a cavity within the innermost layer, said portions of the respective inner sides being parallel to one another, said permanent magnet layers including an inner layer and an outer layer, said inner layer being positioned in a cavity of said outer layer to generate a magnetic field in the same direction as that generated by said outer layer, said outer layer being formed of a permanent magnetic material having a remanence lower than that of said inner layer, and wherein each of said permanent magnet layers is formed of a material that has a remanence no greater than that of the permanent magnet material of any of said layers thereunder.

2. The permanent magnet of claim 1 wherein said outer layer of said permanent magnet is yoked and said inner layer of said permanent magnet is yokeless.

3. The permanent magnet of claim 1 wherein said outer layer of said permanent magnet is hybrid and said inner layer of said permanent magnet is yokeless.

4. The permanent magnet of claim 1 wherein said outer layer of said permanent magnet is yokeless and said inner layer of said permanent magnet is yokeless.

5. The permanent magnet of claim 1 wherein said outer layer is yoked, and further comprising a partial non-permanent-magnetized yoke on said inner layer, and a shunt of a permanent magnetic material mounted to shunt said partial yoke.

6. The permanent magnet of claim 1 wherein said outer layer is yoked and said inner layer has a yoke comprised of a shunt of a permanent magnetic material.

7. A permanent magnetic structure comprising a layer of a permanent magnetic material having a given remanence, said layer surrounding the sides of a cavity in a predetermined cross section thereof and generating a uniform field in the cavity, and a return path external of said layer, with respect to said cavity, for flux generated by said layer of magnetic material, said return path being at least partially of a permanent magnetic material.

8. The permanent magnetic structure of claim 7 wherein a part of said return path is comprised of a yoke of non-magnetized passive material.

9. A high strength permanent magnet comprising a first layer of permanent magnetic material having a first inner side defining a wall of a first cavity, said first layer being positioned to generate a uniform magnetic field perpendicular to said first side in said first cavity and to surround all sides of said first cavity in a predetermined cross section of said permanent magnet, a second layer of permanent magnetic material within said first cavity and having a second inner side defining a wall of a second cavity and surrounding all sides of said second cavity in said cross section, said second layer being positioned to generate a uniform magnetic field perpendicular to said second side in said second cavity and in the same direction as the field generated by said first layer, said first layer being formed of a permanent magnetic material having a remanence lower than that of said second layer.

* * * * *